United States Patent [19]
Liu et al.

[11] Patent Number: 6,091,247
[45] Date of Patent: Jul. 18, 2000

[54] CALIBRATION METHOD FOR STEP ATTENUATOR

[75] Inventors: Woo-Yang Liu; Chun-Hsiung Hwang; Ming-Ho Hung, all of Hsinchu, Taiwan

[73] Assignee: Industrial Technology Research Institute, Hsinchu, Taiwan

[21] Appl. No.: 09/021,199

[22] Filed: Feb. 10, 1998

[30] Foreign Application Priority Data

Sep. 26, 1997 [CN] China ................................ 86115372

[51] Int. Cl.[7] ................................................ G01R 35/00
[52] U.S. Cl. ............................................ 324/601; 324/638
[58] Field of Search ........................................ 324/69, 638

[56] References Cited

U.S. PATENT DOCUMENTS 5,347,239  9/1994  Loehner et al. ........................... 333/81
5,408,205  4/1995  Blacka ..................................... 333/81
5,608,330  3/1997  Heuermann et al. .................... 324/601

*Primary Examiner*—Josie Ballato
*Assistant Examiner*—James C Kerveros
*Attorney, Agent, or Firm*—Merchant & Gould P.C.

[57] ABSTRACT

The present invention relates to a calibration method for step attenuator that is utilized in wide-band RF instruments, wherein the step attenuator comprises a plurality of single-stage attenuators connected in series. Use of the method disclosed in this invention allows one to obtain attenuation of the attenuator under various circumstances by computing measurements of single-stage attenuation. As opposed to the conventional calibration method, this invention is advantageous in reducing time for taking measurements, in elevating total attenuation of the object to be tested, and in simplifying the method of calibration and testing.

2 Claims, 3 Drawing Sheets

CALIBRATION METHOD FOR STEP ATTENUATOR

FIELD OF INVENTION

The present invention relates to a calibration method for step attenuators and can be implemented to RF instruments, such as synthesized signal generators, spectrum analyzers, or network analyzers . . . etc. In taking measurements, step attenuators are essential for input power and output power adjustments; step attenuators are particularly indispensable in the field of communication test instruments.

BACKGROUND OF INVENTION

Receiving test system is generally used in calibration of step attenuators. When the object to be tested relates to calibration of wideband signals, the calibration instrument must be tuned with the tested frequency and re-calibrated for each test point. Once the instrument is tuned in the same frequency, it requires additional calibration when the calibrated attenuation exceeds the attenuation prescribed by the instrument. Therefore, in an actual operation of calibrating a step attenuator, the calibration instrument constantly and repetitively performs self calibration that results in great time consumption. Testing may also be prohibited due to the limitation of calibration in an alternative condition that the attenuation of the object to be tested exceeds the total attenuation of the calibration instrument. Thus, the calibration instruments need only calibrate once by utilizing the present invention without suffering from the limitation of the total attenuation of the object to be tested.

OBJECTS OF INVENTION

It is thus an object of this invention to provide a calibration method for step attenuators by testing S-parameters, characterized in that, the instrument requires only one calibration prior to its use so as to reduce time for calibration, that the calibrated attenuation is not limited by the instrument so as to expand the dynamic range of input calibration, and that calibration is merely required for single-stage attenuation without repetitively testing attenuators of various combinations so as to simplify the calibration method.

DETAIL EXPLANATIONS OF INVENTION

Figure 1:
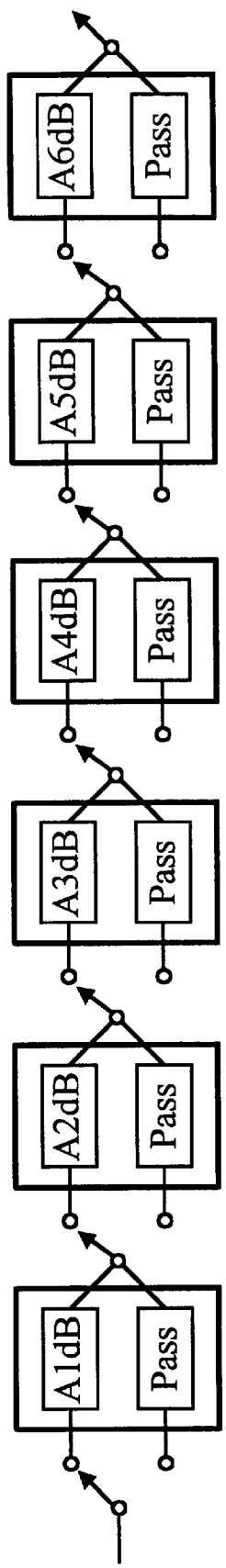
FIG. 1 illustrates a schematic view of a step attenuator, wherein the input and output impedance are both 50 Ω.
Figure 2:
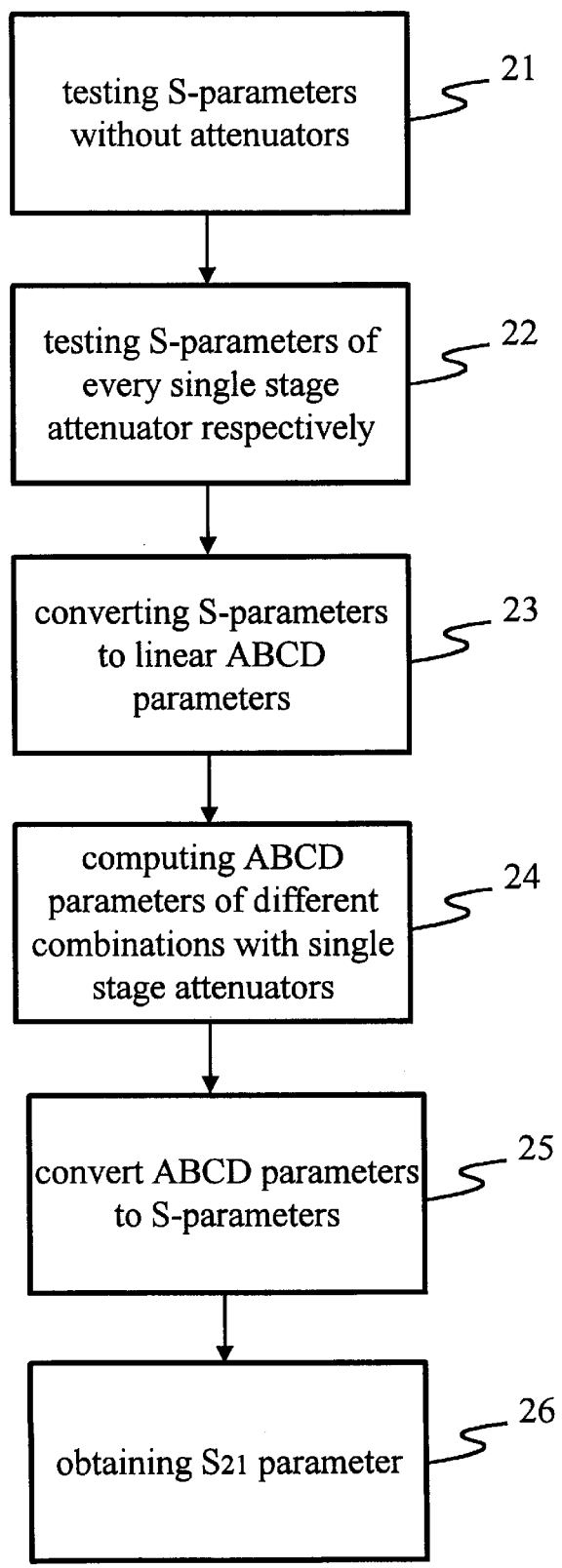
FIG. 2 is a flowchart illustrating the calibration method for the step attenuator of this invention.

FIG. 1 illustrates a schematic view of a step attenuator, wherein the input and output impedance of the system are both 50 Ω. The calibration method for such a step attenuator is explained in accompany with FIG. 2 as follows:

1. Calibration Proecdures:

Block 21: Testing S-parameters without attenuators. Attenuators $A_1$ through $A_6$ are all set at by-pass to test S-parameters $$\begin{bmatrix} S_{11} & S_{12} \\ S_{21} & S_{22} \end{bmatrix}_{0dB},$$

wherein the subscript 0 dB of the matrix $$\begin{bmatrix} S_{11} & S_{12} \\ S_{21} & S_{22} \end{bmatrix}_{0dB}$$

represents the measurements of parameters $S_{11}$, $S_{12}$, $S_{21}$, and $S_{22}$ taken from 0 dB attenuator Block 22:

(a) Testing S-parameters of the first attenuator by passing through the first $A_1$dB attenuator alone and setting the remaining attenuators at by-pass. The values of S-parameters measured under the given condition are represented by $$\begin{bmatrix} S_{11} & S_{12} \\ S_{21} & S_{22} \end{bmatrix}_{AdB},$$

wherein $A_1$dB represents the measurements of parameters $S_{11}$, $S_{12}$, $S_{21}$, and $S_{22}$ taken from $A_1$dB attenuator.

(b) Testing the second $A_2$d$A_2$ attenuator with setting the remaining attenuators at by-pass. The values of S-parameters measured under the given condition are represented by $$\begin{bmatrix} S_{11} & S_{12} \\ S_{21} & S_{22} \end{bmatrix}_{A_2dA_2},$$

wherein $A_2$d$A_2$ represents the measurements of parameters $S_{11}$, $S_{12}$, $S_{21}$, and $S_{22}$ taken from $A_2$d$A_2$ attenuator.

(c) Accordingly, four sets of S-parameters $$\begin{bmatrix} S_{11} & S_{12} \\ S_{21} & S_{22} \end{bmatrix}_{A_3dB},$$

$$\begin{bmatrix} S_{11} & S_{12} \\ S_{21} & S_{22} \end{bmatrix}_{A_4dB},$$

$$\begin{bmatrix} S_{11} & S_{12} \\ S_{21} & S_{22} \end{bmatrix}_{A_5dB},$$

and $$\begin{bmatrix} S_{11} & S_{12} \\ S_{21} & S_{22} \end{bmatrix}_{A_6dB}$$

are measured by testing $A_3$dB, $A_4$dB, $A_5$dB and $A_6$dB attenuators, respectively. The following combination of $A_1$dB+BdB attenuators may now be obtained from the above seven sets of S-parameters.

Figure 3:
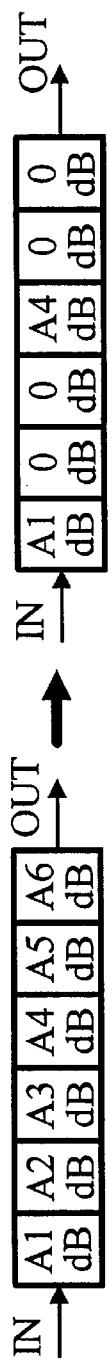
FIG. 3 illustrates a step attenuator according to FIG. 1, wherein attenuation of attenuators $A_1$ and $A_4$ are activated and the remaining attenuators are set at by-pass.

2. Computation Procedures:

As shown in FIG. 3, when attenuators $A_1$ and $A_4$ are activated and the remaining attenuators are set at by-pass, attenuation activated by attenuators $A_1$ and $A_4$ equals the difference between the consumption at all-zero-activating attenuation and the sum of attenuation activated by attenuator $A_1$ and attenuation activated by attenuator $A_4$.

Block 23 and Block 24: Mathematical Computation (a) Converting four S-parameter matrix obtained by activating attenuator $A_1$, attenuator $A_4$, attenuators $A_1$ and $A_4$, and setting all attenuators at zero attenuation value respectively into four ABCD-parameter matrix.

$$\begin{bmatrix} S_{11} & S_{12} \\ S_{21} & S_{22} \end{bmatrix}_{A_1} \rightarrow \begin{bmatrix} A & B \\ C & D \end{bmatrix}_{A_1}, \begin{bmatrix} S_{11} & S_{12} \\ S_{21} & S_{22} \end{bmatrix}_{A_4} \rightarrow \begin{bmatrix} A & B \\ C & D \end{bmatrix}_{A_4}$$

$$\begin{bmatrix} S_{11} & S_{12} \\ S_{21} & S_{22} \end{bmatrix}_{A_1+A_4} \rightarrow \begin{bmatrix} A & B \\ C & D \end{bmatrix}_{A_1+A_4}, \begin{bmatrix} S_{11} & S_{12} \\ S_{21} & S_{22} \end{bmatrix}_{0dB} \rightarrow \begin{bmatrix} A & B \\ C & D \end{bmatrix}_{0dB}$$

Figure 4:
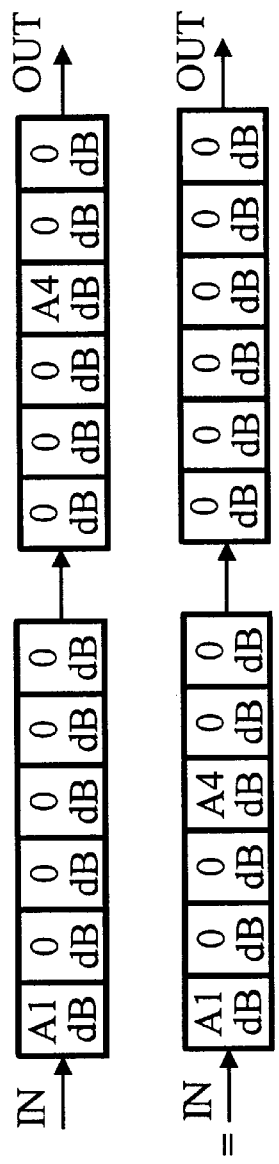
FIG. 4 is a schematic view illustrating attenuation activated by attenuators $A_1$ and $A_4$, which equals the difference between the consumption at all-zero-activating attenuation and the sum of attenuation activated by attenuator $A_1$ and attenuation activated by attenuator $A_4$.

(b) It is known from FIG. 4 that $$\begin{bmatrix} A & B \\ C & D \end{bmatrix}_{A_1} \begin{bmatrix} A & B \\ C & D \end{bmatrix}_{A_4} = \begin{bmatrix} A & B \\ C & D \end{bmatrix}_{A_1+A_4} \begin{bmatrix} A & B \\ C & D \end{bmatrix}_{0dB} \Rightarrow \begin{bmatrix} A & B \\ C & D \end{bmatrix}_{A_1+A_4} =$$

$$\begin{bmatrix} A & B \\ C & D \end{bmatrix}_{A_1} \begin{bmatrix} A & B \\ C & D \end{bmatrix}_{A_4} \begin{bmatrix} A & B \\ C & D \end{bmatrix}_{0dB}^{-1}$$

(c) Attenuation is then computed by taking $20 \log |S_{21}|$ of S-parameter matrix that are converted from $$\begin{bmatrix} A & B \\ C & D \end{bmatrix}_{A_1+A_4}$$

Figure 5:
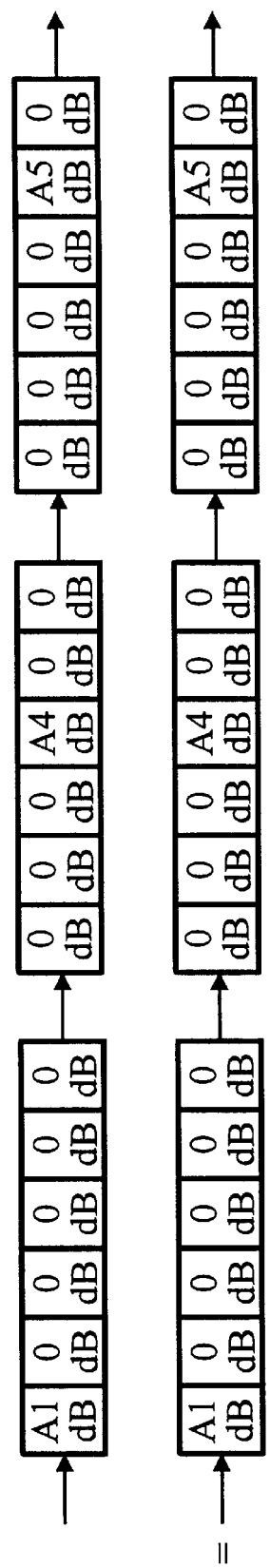
FIG. 5 is a schematic view illustrating attenuation activated by attenuators $A_1$, $A_4$, and $A_5$, deduced in a manner similar to FIG. 4.

Similarly, as shown in FIG. 5, when attenuators $A_1$, $A_4$, and $A_5$ are activated and the remaining attenuators are set at by-pass, $$\begin{bmatrix} A & B \\ C & D \end{bmatrix}_{A^1} \cdot \begin{bmatrix} A & B \\ C & D \end{bmatrix}_{A_4} \cdot \begin{bmatrix} A & B \\ C & D \end{bmatrix}_{A_5} =$$

$$\begin{bmatrix} A & B \\ C & D \end{bmatrix}_{A_1+A_4+A_5} \cdot \begin{bmatrix} A & B \\ C & D \end{bmatrix}_{0dB}^2 \Rightarrow \begin{bmatrix} A & B \\ C & D \end{bmatrix}_{A^1+A_4+A_5} =$$

$$\begin{bmatrix} A & B \\ C & D \end{bmatrix}_{A^1} \cdot \begin{bmatrix} A & B \\ C & D \end{bmatrix}_{A_4} \cdot \begin{bmatrix} A & B \\ C & D \end{bmatrix}_{A_5} \cdot \left( \begin{bmatrix} A & B \\ C & D \end{bmatrix}_{0dB}^{-1} \right)^2$$

Accordingly, for an attenuator having N single-stage attenuators, the matrix $$\begin{bmatrix} A & B \\ C & D \end{bmatrix}_m$$

of attenuation while activating any m attenuators $K_1$, $K_2$, ..., $K_m$ is represented as follows:

$$\begin{bmatrix} A & B \\ C & D \end{bmatrix}_m = \begin{bmatrix} A & B \\ C & D \end{bmatrix}_{K_1} \cdot \begin{bmatrix} A & B \\ C & D \end{bmatrix}_{K_2} \cdot \ldots \cdot \begin{bmatrix} A & B \\ C & D \end{bmatrix}_{K_m} \cdot \left( \begin{bmatrix} A & B \\ C & D \end{bmatrix}_{0dB}^{-1} \right)^{m-1}$$

The desired attenuation is then computed by taking $20 \log |S_{21}|$ from of matrix $$\begin{bmatrix} S_{11} & S_{12} \\ S_{21} & S_{22} \end{bmatrix}_m,$$

that are converted from $$\begin{bmatrix} A & B \\ C & D \end{bmatrix}_m.$$

Similarly, any attenuation may be computed in such a manner.

Attenuation of various combinations can be easily computed by using the above calibration and computation procedures. For instance, the step attenuator shown in FIG. 1 comprises six single-stage attenuators and thus only requires six calibrations. Though $2^6=64$ possible combinations exist in such a step attenuator, calibration is not required for each of the combinations thereby reducing time for 57 additional calibration and testing.

The invention can also be realized by other specific embodiments without departing from the concepts and essential features thereof. Therefore, all embodiments expounded in the foregoing descriptions are illustrative but not limited in any domain. All modifications complying with the concepts and scope of the claims or other equivalence are contemplated by the realm of the invention.

What is claimed is:

1. A calibration method for step attenuator including N attenuators ($N \geq 1$) which are respectively named as $A_1$, $A_2$, ..., $A_N$, said method comprising the following steps:

(a) testing S-parameters without attenuation, said S-parameters being represented as $$\begin{bmatrix} S_{11} & S_{21} \\ S_{12} & S_{22} \end{bmatrix}_{0dB};$$

(b) testing S-parameters of individual single-stage attenuators, said S-parameters being respectively represented as $$\begin{bmatrix} S_{11} & S_{21} \\ S_{12} & S_{22} \end{bmatrix}_{A_1}, \begin{bmatrix} S_{11} & S_{21} \\ S_{12} & S_{22} \end{bmatrix}_{A_2} \ldots \begin{bmatrix} S_{11} & S_{21} \\ S_{12} & S_{22} \end{bmatrix}_{A_N},$$

(c) converting respectively the above (N+1) sets of S-parameters to linearized parameters being represented as, $$\begin{bmatrix} A & B \\ C & D \end{bmatrix}_{0dB}, \begin{bmatrix} A & B \\ C & D \end{bmatrix}_{A_1}, \begin{bmatrix} A & B \\ C & D \end{bmatrix}_{A_2} \ldots \text{and } \begin{bmatrix} A & B \\ C & D \end{bmatrix}_{A_N},$$

computing linearized parameter of any m attenuators $K_1$, $K_2$, ..., $K_m$ selected from said N attenuators $A_1$, $A_2$, ..., $A_N$) of said N attenuators connected in series by means of the following mathematical formula $$\begin{bmatrix} A & B \\ C & D \end{bmatrix}_{(K_1+K_2+\ldots+K_m)dB} =$$

-continued $$\begin{bmatrix} A & B \\ C & D \end{bmatrix}_{K_1} \cdot \begin{bmatrix} A & B \\ C & D \end{bmatrix}_{K_2} \cdot \ldots \cdot \begin{bmatrix} A & B \\ C & D \end{bmatrix}_{K_m} \cdot \left( \begin{bmatrix} A & B \\ C & D \end{bmatrix}_{0dB}^{-1} \right)^{m-1} ;$$

and (d) converting said linearized parameters $$\begin{bmatrix} A & B \\ C & D \end{bmatrix}_{(K_1+K_2+\ldots+K_m)dB}$$

to S-parameters $$\begin{bmatrix} S_{11} & S_{21} \\ S_{12} & S_{22} \end{bmatrix}_{(K_1+K_2+\ldots+K_m)dB}$$

for computing attenuation corresponding to attenuators $K_1, K_2, \ldots, K_m$ connected in series.

2. The calibration method according to claim 1, wherein said attenuation corresponding to said attenuators $K_1, K_2, \ldots, K_m$ connected in series is governed by $20 \log |S_{21}|$.

* * * * *

UNITED STATES PATENT AND TRADEMARK OFFICE
CERTIFICATE OF CORRECTION

PATENT NO. : 6,091,247
DATED : July 18, 2000
INVENTOR(S) : Liu et al.

It is certified that error appears in the above-identified patent and that said Letters Patent is hereby corrected as shown below:

Column 2, line 26, replace "AdB" with --$A_1 dB$--.

Column 2, lines 31, 37, and 40-41, replace "$A_2 dA_2$" with --$A_2 dB$--.

Column 2, line 66, replace "$A_1 dB + BdB$" with --$A_1 dB + A_4 dB$--.

Column 2, line 66, between "attenuators" and "may", insert --in Fig. 3--.

Column 3, line 8, replace "and Block 24" with --to Block 26--.

Column 3, line 15, outside of bracket, replace "A" with --$A_1$--.

Column 3, lines 43, 46, and 49 outside of bracket, replace "$A^1$" with --$A_1$--.

Column 4, lines 60-61, replace "selected from said N attenuators $A_1, A_2..., A_N$) of said N attenuators" with --selected from said N attenuators $A_1, A_2..., A_N$--.

Column 4, line 46, end of the line, add --and;--.

<p style="text-align:right">Signed and Sealed this

Seventeenth Day of April, 2001</p>

Attest:

NICHOLAS P. GODICI

*Attesting Officer*    Acting Director of the United States Patent and Trademark Office